April 15, 1958 F. H. GUTH 2,831,160
NEGATIVE FEEDBACK MAGNETIC AMPLIFIER WITH TEMPERATURE COMPENSATION
Filed Oct. 20, 1954
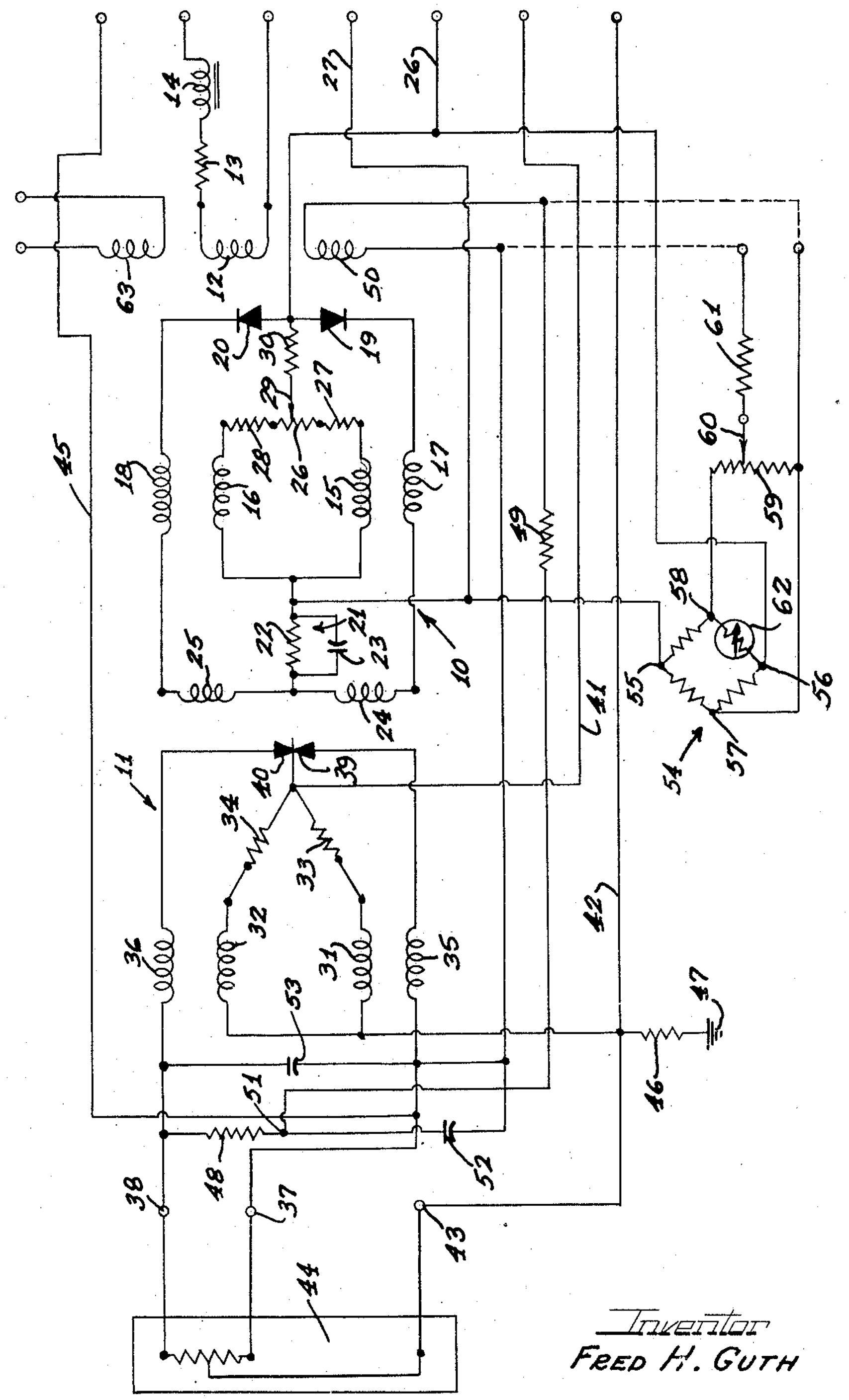
Inventor
FRED H. GUTH
by Hill, Sherman, Meroni, Gross & Simpson Attys.

United States Patent Office 2,831,160

Patented Apr. 15, 1958

2,831,160

NEGATIVE FEEDBACK MAGNETIC AMPLIFIER WITH TEMPERATURE COMPENSATION

Fred H. Guth, Warrensville Heights, Ohio, assignor to Thompson Products, Inc., Cleveland, Ohio, a corporation of Ohio Application October 20, 1954, Serial No. 463,485

1 Claim. (Cl. 323—89)

The present invention relates to magnetic amplifiers and more particularly relates to a magnetic amplifier system having negative feedback and temperature compensation to reduce temperature drift and to improve the control characteristics thereof.

In my co-pending applications for patent respectively entitled "Magnetic Amplifier" Serial No. 379,204, filed September 9, 1953, and U. S. Serial No. 390,894 filed November 9, 1953, of which applications this is a continuation-in-part, there has been described various magnetic amplifier systems which, while having general utility, may be most advantageously used in such an overall controll system as that described in the co-pending application of Walter R. Chapman and Stephen H. Fairweather entitled "Control System for Turbine Driven Alternators," U. S. Serial No. 382,582, filed September 28, 1953, now Patent No. 2,790,091. While the magnetic amplifiers of my co-pending applications have proven most successful in such installations, it has been found to be most desirable to improve the gain and response time thereof as well as reduce "temperature drift" and thereby improve the overall operating characteristics of the magnetic amplifiers.

When such magnetic amplifiers are utilized in such systems as the turbine driven alternator controls set out in the Chapman et al. application above identified, they may be subject to severe temperature changes ranging from about −70° F. to about 185° F. These extreme temperature variations are apt to cause changes in the gain and stability of the magnetic amplifier and thereby change the operating and control characteristics of the alternator control system. Further such temperature changes may be effective to reduce stability of the alternator control system.

A magnetic amplifier incorporating the principles of the present invention, however, will have circuitry therein operable to compensate for any variations in the characteristics of the elements of the magnetic amplifier due to temperature changes and thereby cause the system to be extremely stable and have substantially zero temperature drift at least in the range of −70° F. to +185° F. A magnetic amplifier having temperature compensation circuitry incorporating the principles of this invention may have the amplifier temperature drift thereof reduced to as low as ±1% or 2% in an ambient temperature range of −70° F. to +185° F., and this temperature stability and the circuitry providing the same forms a most important object and feature of this invention.

Another important object and feature of this invention is to incorporate negative feedback circuitry in a magnetic amplifier while increasing the gain of the magnetic amplifier so as to give the magnetic amplifier "lead" characteristics. That is, in an alternator control system it is most advantageous to have the control system "anticipate" or "lead" variations in the loads on the alternators and other comparable output characteristics thereof. Through the utilization of circuitry permitting increased amplifier gains with delayed negative feedback in the amplifier, as an external feedback circuit, the magnetic amplifier will have "lead characteristics" by reducing the time constant of the magnetic amplifier to its inherent minimum. Thus, in a two-stage half wave magnetic amplifier, wherein the inherent minimum time constant is 1.5 cycles, when the system is used in a 400 cycle aircraft power supply, the time constant would be on the order of 3.75 milliseconds.

It is, therefore, another important object of the present invention to provide a new and improved magnetic amplifier system wherein the gain and stability characteristics of the magnetic amplifier have been substantially improved, and the response time thereof has been reduced substantially to its inherent minimum.

Another object of the present invention is to provide a magnetic amplifier system with a new and improved delayed negative feedback circuit.

Still another object of the present invention is to provide new and improved means for increasing the gain of a magnetic amplifier.

Still another object of the present invention is to provide new and improved means for decreasing the response time of a magnetic amplifier.

Still another object of the present invention is to provide a new and improved circuit for decreasing temperature drift characteristics of a magnetic amplifier.

Still another object of the present invention is to provide a new and improved resistance type bridge system wherein one of the resistance elements of the bridge has temperature resistant characteristics such as to maintain the balance of the magnetic amplifier substantially constant irrespective of temperature variations.

Still other objects, features and advantages of the present invention will become readily apparent from the following detailed description of the present invention and a preferred embodiment thereof, from the claim, and from the accompanying single figure of schematic drawing in which each and every detail shown is fully and completely disclosed as a part of this specification and in which there is shown a schematic representation of a magnetic amplifier system embodying the principles of the present invention.

As shown on the drawings:

There is illustrated in the single figure of drawing a two-stage magnetic amplifier having external delayed negative feedback and temperature compensation. The magnetic amplifier itself is comprised of two half wave stages which are cascaded and arranged with an input or preamplifier stage 10 as the first stage and an output or power amplifier stage 11.

The control signal to be supplied into the magnetic amplifier system may be supplied from any appropriate source of such control signals to which the magnetic amplifier will be responsive. Such an appropriate source of control signal would be the output of the mixer system in the turbine driven alternator control described in the hereinabove identified co-pending application of Chapman et al. From whatever source of control signal such a signal may be supplied, however, it is fed into the magnetic amplifier signal to control the energization of the control winding 12 of the preamplifier stage in series with an A. C. bucking impedance including the resistor 13 and the inductance 14. These series A. C. bucking impedence elements are operative to keep the control signal supply and the control winding 12 free from A. C. potentials which may be fed back into the control circuit through transformer action in the preamplifier stage 11.

This A. C. bucking function is further enhanced by connecting the A. C. flux setting or bias windings 15 and 16 in parallel so that the second harmonics will freely circulate therein and thereby fail to effect even harmonic feedback into the control system.

Circulating currents in the load windings 17 and 18 of the preamplifier stage 10 are substantially prevented by the rectifier stacks 19 and 20 which are in series therewith respectively. With this arrangement of parts, the effects of the presence of the second harmonics and their detrimental character are substantially avoided so that the response time of the first stages of the magnetic amplifier is substantially reduced to its minimum inherent value and the gain of the amplifier is substantially higher than it would be under conditions where second and other even harmonic potentials of the fundamental frequency are permitted to be fed back into the control signal system.

At the same time, the gain in the amplifier is still further increased by increasing the average magnitude of the D. C. signal delivered to the preamplifier through the inclusion of an RC filter network 21, including a resistor 22 in parallel with the capacitor 23 and in series with the load circuit including a first control winding 24 of the power amplifier stage in series with the load winding 17 of the preamplifier, and a second control winding 25 of the power amplifier stage 11 in series with the second load winding 18 of the preamplifier. While the average value of D. C. control signal is not increased by this RC network, the effects thereof are substantially increased since the average D. C. in the control windings of the second stage 24 and 25 are increased in the average D. C. of the load winding 17 and 18 of the preamplifier stage 10 are increased. In greater detail, the circuit just described includes supplying power to the load windings of the preamplifier and the control windings of the power amplifier from any convenient source such as would be connected to power leads 26 and 27. Power lead 26 would be connected between the opposed rectifier stacks 19 and 20 through which power would flow through the stack 19 to the load winding 17 and through to the control winding 24 of the power amplifier stage and thence through the filter network 21 back to the lead 27. On the other side of the network, power would flow from the lead 26 through the rectifier 20, and to the load winding 18 and therethrough to the control winding 25 of the power amplifier stage to the filter 21 and thence back to the power lead 27.

By this arrangement, circulating currents in the load circuit are diminished since the system is only a half wave system and the rectifiers 19 and 20 are so opposed that current flows in the same direction through the load windings 17 and 18 and only on a one-half cycle of the input A. C. power supplied thereto over the leads 26 and 27.

Operational characteristics of the preamplifier stage of the magnetic amplifier are further improved and enhanced by utilizing the flux presetting and biasing network to reduce the quiescent current to a zero value when the input control signal has a zero value. That is, the flux presetting and biasing network may be so adjusted that there will be no current through the load windings of the preamplifier stage and the control windings of the power amplifier stage when the input signal to the primary control winding 12 is zero. This may be effected by connecting a potentiometer 26 between resistors 27 and 28 which are in series, respectively, with the bias windings 15 and 16. The adjustable arm 29 of the potentiometer is in series with a resistor 30 having its other end connected to the power lead 26 or the junction between the closed rectifier stacks 19 and 20. By this same arrangement the two halves or the two reactors of the preamplifier stage 10 may be balanced to compensate for any slight discrepancies between the elements and operational characteristics thereof.

It should be understood here that each of the two stages of this cascaded magnetic amplifier has a pair of reactors such as reactors having cores of very high permeability and low reluctance magnetic characteristics with substantially narrow rectangular hysteresis loops. A preferred construction for such a core is one with a ribbon or tape toroidally wound with the coils thereon.

In the preamplifier stage each reactor core would have one load winding thereon and one flux presetting or biasing winding thereon and the control winding 12 would then encompass both reactor cores. The operational characteristics of the arrangement is such that there would be no peripheral magnetic circulation between the two cores and opposing A. C. fluxes through the control winding 12 would be "bucked out" thereby still further reducing the possibility of A. C. feedback into the control system.

Energization of the flux presetting and biasing windings 15 and 16 is taken from the same source of power as that which supplies the load winding 17 and 18 and more particularly taken from the leads 26 and 27. The lead 26 is connected to one end of the resistor 30 so that current therefrom passes through the resistor 30 to the potentiometer 26 through the arm 29 thereof. There the current halves divide due to the parallel relationship between the biasing windings 15 and 16 whereby one path is through the upper portion of the potentiometer 26 and thence through the resistor 28 and the biasing winding 16 in series, the other end of the biasing winding 16 being connected to the power lead 27. The other path extends through the lower half of the potentiometer 26 and thence through the resistor 27 in series with the biasing winding 15 having its other end connected to the power lead 27. By proper adjustment of the rheostat 26 the quiescent current through the preamplifier may be adjusted to zero under no control signal conditions and the two reactors can be properly balanced.

The power amplifier stage 11 is constructed substantially identically with the preamplifier stage so that flux presetting windings 31 and 32 are in parallel, but each being in series with the resistors 33 and 34 respectively. The load windings 35 and 36 each have one end thereof connected to magnetic amplifier output terminals 37 and 38 respectively while the other ends thereof respectively connected to oppositely arranged rectifier stacks 39 and 40 respectively. A power lead 41 from an appropriate source of alternating current electrical energy is connected to the several reactor windings at the junction of the resistors 33 and 34 which is also the junction of the opposed rectifier stacks 39 and 40. The other side of the power source for the power amplifier stage 11, as indicated by the lead 42 extends to a third output terminal 43 where it is connected to the load 44 and then through to the output terminals 37 and 38 which are connected to the load windings 35 and 36.

It may be noted here that in the operation of a two stage half wave magnetic amplifier embodying the principles of the present invention it has been found desirable to supply the power amplifier stage with power at a substantially higher potential, as between the leads 41 and 42, than the potential supplied to the preamplifier stage 10, as between the leads 26 and 27.

In addition to the normal operating and biasing characteristics of the flux presetting and biasing windings 31 and 32, their operation may be enhanced by supplying a D. C. bias current thereto as through the lead 45 which is connected thereto at one side thereof, the other side thereof being connected through a resistor 46 to ground indicated at 47.

Bias of the power amplifier stage is not, however, fully responsible for the improved gain of magnetic amplifier embodying the principles of the present invention. The gain of the amplifier is, as hereinabove pointed out, still further improved by the filter RC network 21 which increases the average value of the pulsating D. C. through the preamplifier load windings 17 and 18. The general operating characteristics including the gain as well as the response time are still further improved by including in the network a delayel negative feedback arrangement wherein a resistor 48 is connected at one side to the output 38 of the magnetic amplifier and at the other side thereof to a resistor 49 which is connected to one side of a supplementary control winding 50 in the preamplifier stage 10. A center connection point 51 between the resistors 48 and 49 is connected to a capacitor 52 which is further connected to the opposite side of the intermediate control winding 50 as well as to the output end of the load winding 35 of the power amplifier stage and a capacitor 53 which is connected between the output terminals 37 and 38 or between the output ends of the load windings 35 and 36 of the power amplifier stage 11. Herein the selection of values for the resistors and capacitors is such that the value of the resistor 48 and the value of the capacitor 52 are so adjusted and selected as to give a proper delay to the negative feedback while the value of the resistor 49 is so selected so as to give the amplifier its required steady-state gain.

By a careful selection of the values of the various components of the entire magnetic amplifier system as hereinabove described, and by a careful determination of the quality thereof, the temperature drift of the magnetic amplifier system with its external negative feedback control may be maintained within relatively close limits particularly when the amplifier is to be used under conditions where the ambient temperature has a relatively small change from time to time. When the ambient temperature conditions are such that they are likely to change over a very wide range such as the range of from −70° F. to a range of +185° F. as might occur in an aircraft installation, the temperature drift or change in gain with temperature may be of considerable magnitude and therefore be of important significance. By the present invention, temperature variations and thereby temperature drift of the amplifier is so controlled that there is substantially no temperature drift even though the temperature may change variously through the range described. This may be effected by incorporating into the system a resistance bridge 54 which is supplied with power from the preamplifier power input leads 26 and 27. That is, the preamplifier power input leads 26 and 27 are connected to corners 55 and 56 of the bridge network 54 to supply the bridge with electrical energy. The opposite corners of the bridge, as at 57 and 58 are connected across a potentiometer 59 having its arm 60 connected through a resistor 61 to one side of the supplementary control winding 50 and to the relay network capacitor 52. The other side of the supplementary control winding 50 is connected to the bottom of the potentiometer 59 and to the corner 57 of the resistance bridge network 54.

One leg 62 of the resistance bridge 54 includes an element having a negative temperature coefficient of resistance such as a Thermistor or the like while the other three legs are balanced resistances. Through these means, the amplitude and phase of the signal supplied to the supplementary control winding 50 of the preamplifier stage 10 is so controlled as to compensate for changes in the characteristics of the other elements of the magnetic amplifier and the other components thereof with temperature. Thereby, the magnetic amplifier system is caused to operate independently of temperature variations and the temperature drift thereof may be maintained within a range of ±1 or 2%, even though the temperature may vary to a range of from about − 70° F. to about +185° F. The system may be adjusted to a zero condition at any desired ambient temperature by presetting or adjusting the arm 60 on the potentiometer 59.

A further supplementary control winding 63 may be utilized for a further input to the magnetic amplifier such as from the reset network disclosed in the hereinabove identified co-pending application of Chapman et al.

From the foregoing it will be readily observed that numerous variations and modifications may be made without departing from the true spirit and scope of the novel concepts of the principles of this invention. I, therefore, intend to cover all such modifications and variations as fall within the true spirit and scope of the novel concepts and principles of this invention.

I claim as my invention:

In a magnetic amplifier having cascaded stages, a control winding in a stage ahead of the last stage, a resistance-capacitance feedback delay network connected between said control winding and the output of a subsequent stage, means to supply a signal to the control winding, means connected to said control winding and cooperating with said resistance-capacitance feedback network to vary the phase and amplitude of said signal in accordance with temperature changes to compensate for changes in the characteristics in the components of the magnetic amplifier and maintain the temperature drift of the magnetic amplifier substantially negligible over the range of temperatures to which the magnetic amplifier will be subjected in use.

References Cited in the file of this patent

UNITED STATES PATENTS

| | | |
|---|---|---|
| 2,554,203 | Morgan | May 22, 1951 |
| 2,561,329 | Ahlen | July 24, 1951 |

FOREIGN PATENTS

| | | |
|---|---|---|
| 671,836 | Great Britain | May 14, 1952 |
| 699,542 | Great Britain | Nov. 11, 1953 |